(12) United States Patent
Liao et al.

(10) Patent No.: US 11,020,821 B2
(45) Date of Patent: Jun. 1, 2021

(54) CUTTING DEVICE FOR THIN SEMICONDUCTOR WAFER AND CUTTING METHOD THEREOF

(71) Applicant: ASTI GLOBAL INC., TAIWAN, Changhua County (TW)

(72) Inventors: Chien-Shou Liao, New Taipei (TW); Chih-Wei Yu, Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 275 days.

(21) Appl. No.: 16/173,007

(22) Filed: Oct. 29, 2018

(65) Prior Publication Data

US 2019/0126394 A1    May 2, 2019

(30) Foreign Application Priority Data

Nov. 1, 2017 (TW) .................................. 106137782

(51) Int. Cl.

| | | |
|---|---|---|
| *B23K 26/0622* | (2014.01) | |
| *B23K 26/03* | (2006.01) | |
| *B23K 26/082* | (2014.01) | |
| *B23K 26/16* | (2006.01) | |
| *B23K 26/70* | (2014.01) | |
| *B23K 26/142* | (2014.01) | |

(Continued)

(52) U.S. Cl.
CPC ........ *B23K 26/0624* (2015.10); *B23K 26/032* (2013.01); *B23K 26/082* (2015.10); *B23K 26/0821* (2015.10); *B23K 26/142* (2015.10); *B23K 26/16* (2013.01); *B23K 26/707* (2015.10); *B23K 2101/40* (2018.08); *H01L 21/67092* (2013.01)

(58) Field of Classification Search
CPC .............. B23K 2101/40; B23K 26/082; B23K 26/0821; B23K 26/142; B23K 26/707; B23K 26/032; B23K 26/16; B23K 26/0624; B23K 26/035; B23K 26/042; B23K 26/0643; B23K 26/0652; B23K 26/0648; H01L 21/67092
See application file for complete search history.

(56) References Cited

U.S. PATENT DOCUMENTS

| | | | |
|---|---|---|---|
| 2008/0192250 A1* | 8/2008 | Yoo ...................... | B23K 26/082 356/326 |
| 2016/0197015 A1* | 7/2016 | Lei .................... | H01L 21/67207 438/462 |
| 2016/0372349 A1* | 12/2016 | Hyakumura ....... | B23K 26/0622 |

* cited by examiner

Primary Examiner — Dana Ross
Assistant Examiner — Rachel R Rizzo
(74) Attorney, Agent, or Firm — Li & Cai Intellectual Property (USA) Office

(57) ABSTRACT

A cutting device for a thin semiconductor wafer includes a laser light generator and a polygonal mirror structure. The laser light generator is used to provide a femtosecond laser light with a pulse width on a femtosecond order ($10^{-15}$ second). The polygonal mirror structure is used to reflect the femtosecond laser light. The polygonal mirror structure has a plurality of reflective surfaces. The polygonal mirror structure rotates continuously with respect to the femtosecond laser light, such that the femtosecond laser light is sequentially and repeatedly reflected by the plurality of reflective surfaces and projected on a semiconductor wafer. The femtosecond laser light projected on a semiconductor wafer moves repeatedly along a same predetermined direction in a predetermined range during a predetermined time to groove or cut the semiconductor wafer.

9 Claims, 12 Drawing Sheets

(51) Int. Cl.
*H01L 21/67* (2006.01)
*B23K 101/40* (2006.01)

CUTTING DEVICE FOR THIN SEMICONDUCTOR WAFER AND CUTTING METHOD THEREOF

CROSS-REFERENCE TO RELATED PATENT APPLICATION

This application claims the benefit of priority to Taiwan Patent Application No. 106137782, filed on Nov. 1, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

FIELD OF THE PRESENT DISCLOSURE

The present disclosure relates to a processing device for a thin semiconductor wafer and method thereof, and more particularly to a laser processing device for a thin semiconductor wafer and laser processing method thereof.

BACKGROUND OF THE PRESENT DISCLOSURE

Conventional semiconductor processing techniques such as wafer cutting, grooving or patterning are still primarily performed by using metal cutting blades. While such metal cutting blades can cut semiconductor materials such as gallium arsenide and silicon carbide, in order to prevent the blades from damaging the cutting surface, the speed that the blades are fed must be controlled to be within a certain range, so that it is difficult to increase production efficiency.

In addition, lasers, especially high-power lasers, are also currently used in wafer processing and dicing techniques for stripping wafer surfaces to form trenches on the wafer surfaces, and then stress is used to break the dies. With the advancement of laser processing technology, the demand for processing speed and processing power has also been increased. The repetition rate (RR) of a conventional pulse laser is now measured in the order of MHz, and the pulse energy thereof can reach tens of mJ/pulse. However, traditional galvanometer (Galvo) scanners have reached the limit of 15 m/s in scanning speed, and cannot meet demands beyond this limit. Accordingly, application of a conventional pulse laser with a high repetition rate would lead to overly high laser point overlapping, resulting in heat accumulation and expansion of heat affected zones (HAZ). Therefore, while it is necessary to reduce laser power or repetition frequency, implementing such changes would limit processing speed and hinder improvements for production efficiency.

SUMMARY OF THE PRESENT DISCLOSURE

In response to the above-referenced technical inadequacies, the present disclosure provides a cutting device for a thin semiconductor wafer and a cutting method thereof, which can cut a semiconductor wafer having a thickness less than 100 μm through a femtosecond (fs, $10^{-15}$ second) laser light provided by a laser generator and a polygonal mirror structure.

In one aspect, the present disclosure provides a cutting device for a thin semiconductor wafer, which includes a laser light generator and a polygonal mirror structure. The laser light generator is configured to provide a femtosecond laser light with a pulse width on a femtosecond order. The polygonal mirror structure has a plurality of reflective surfaces, and is configured to reflect the femtosecond laser light. The polygonal mirror structure rotates continuously with respect to the femtosecond laser light, such that the femtosecond laser light is sequentially and repeatedly reflected by the plurality of reflective surfaces and projected on a semiconductor wafer, and moves repeatedly along a same predetermined direction within a predetermined range and within a predetermined time to cut the semiconductor wafer.

In another aspect, the present disclosure provides a cutting method for a thin semiconductor wafer, which includes providing a semiconductor wafer; providing, by a laser light generator, a femtosecond laser light with a pulse width on a femtosecond order; and providing a polygonal mirror structure having a plurality of reflective surfaces. The femtosecond laser light is reflected by the polygonal mirror structure. The polygonal mirror structure rotates continuously with respect to the femtosecond laser light, such that the femtosecond laser light is sequentially and repeatedly reflected by the plurality of reflective surfaces and projected on the semiconductor wafer, and moves repeatedly along a same predetermined direction within a predetermined range and within a predetermined time to cut the semiconductor wafer.

Therefore, through the technical features including "a laser light generator for providing femtosecond laser light having a pulse width on the order of fs," "a polygonal mirror structure having a plurality of reflective surfaces for reflecting the femtosecond laser light provided by the generator," and "the polygonal mirror structure rotating continuously with respect to the femtosecond laser light, so that the femtosecond laser light is sequentially and repeatedly reflected by the plurality of reflective surfaces of the polygonal mirror structure and projected on the semiconductor wafer," the cutting device for a thin semiconductor wafer and a cutting method thereof according to the present disclosure expand the application range of a high-speed laser (femtosecond laser), with a scanning speed reaching more than 100 m/s, a femtosecond laser repetition frequency reaching the order of MHz, and an average power reaching more than 100 W, which allows the femtosecond laser light projected on the semiconductor wafer to repeatedly move in the same predetermined direction within a predetermined range and within a predetermined time to cut the semiconductor wafer.

These and other aspects of the present disclosure will become apparent from the following description of certain embodiments taken in conjunction with the following drawings and their captions, although variations and modifications therein may be affected without departing from the spirit and scope of the novel concepts of the present disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
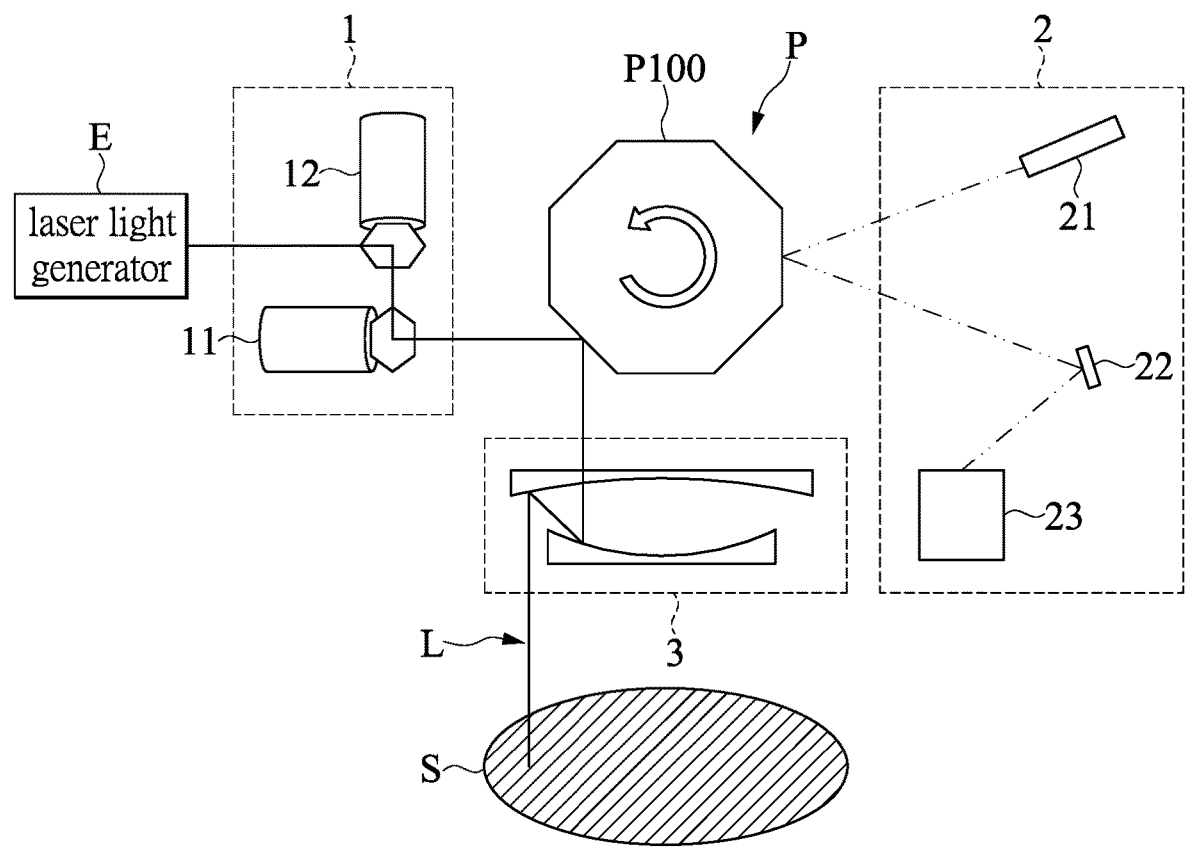
FIG. 1 is a schematic diagram of a cutting device for a thin semiconductor wafer according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which illustrates a cutting device for a thin semiconductor wafer according to the first embodiment of the present disclosure. The present disclosure provides a cutting device D1 for a thin semiconductor wafer, which includes a laser light generator E and a polygonal mirror structure P. In addition, in the present embodiment, the cutting device D1 further includes an optical correction module 1 and a position detection module 2.

Specifically, the laser light generator E is used to provide ultrashort pulse light, and the laser light generator E includes an oscillator, a pulse picker, an optical amplifier, and a modulator. In this embodiment, the laser generator E can provide a femtosecond laser light L with a pulse width on the order of fs, and exemplarily less than 500 fs, and the pulse repetition frequency of the femtosecond laser light L can be greater than 1 MHz so as to maintain a small HAZ, which effectively improves the precision of laser processing. The femtosecond laser light L can be an adjustable wavelength laser light source, which can be changed according to the material of the object to be cut (such as a semiconductor wafer to be cut). For example, infrared light (IR) can be used for metal materials, and ultraviolet light (UV) or green laser can be used for silicon materials. The polygonal mirror structure P has a plurality of reflective surfaces P100 corresponding to its actual polygonal shape. For example, a polygonal mirror structure P can have six reflective surfaces when shaped as a hexagon, eight reflective surfaces for an octagon, ten reflective surfaces for a decagon, and so on. The figures of the present disclosure are exemplified by a polygonal mirror structure P in an octagonal shape and having eight reflective surfaces P100. However, the present disclosure is not limited thereto. In general, the femtosecond laser light L generated by the laser light generator E can be reflected by one of the reflective surfaces P100 of the polygonal mirror structure P, and the reflected laser light can be directed to the object to be cut, for example, a semiconductor wafer S to be cut. When the cutting device D1 is not activated, the laser light generator E of the present disclosure is in a fixed state, and the polygonal mirror structure P also assumes a stationary state. When activated, the position of the laser light generator E remains fixed, while the polygonal mirror structure P rotates with respect to the laser light generator E. In other words, the polygonal mirror structure P can continuously rotate with respect to the femtosecond laser light L of the laser light generator E, whereby the femtosecond laser light L is sequentially projected on the different reflective surfaces P100 of the polygonal mirror structure P (i.e., eight reflective surfaces P100 in this embodiment). The reflective surfaces P100 are moved per unit rotation time of the polygonal mirror structure P, so that the femtosecond laser light L has different light incident angles and light reflection angles with respect to the reflective surfaces P100 per unit rotation time. As the polygonal mirror structure P rotates continuously, the femtosecond laser light L can be sequentially and repeatedly reflected by the plurality of reflective surfaces P100, and then projected onto the semiconductor wafer S to be cut. Then, the femtosecond laser light L projected on the semiconductor wafer S can be repeatedly moved toward or along the same predetermined direction within a predetermined range R on the semiconductor wafer S for a predetermined time, so as to cut the semiconductor wafer S.

Referring still to FIG. 1, the cutting device D1 further includes the optical correction module 1 and the position detection module 2. The optical correction module 1 includes an X-axis galvanometer (X Galvo) 11 and a Y-axis galvanometer (Y Galvo) 12. The X Galvo 11 and the Y Galvo 12 are disposed between the laser light generator E and the polygonal mirror structure P for correcting the femtosecond laser light L emitted by the laser light generator E, so as to facilitate generation of a linear light source of extremely high linearity. After the femtosecond laser light L is emitted from the laser light generator E, it is first reflected by the X Galvo 11, and then reflected by the Y Galvo 12 to a reflective surface P100 of the polygonal mirror structure P.

In fact, the femtosecond laser light L is adjusted by the X Galvo 11 and the Y Galvo 12 of the optical correction module 1 so as to be projected within the aforementioned predetermined range R.

Furthermore, the cutting device D1 further includes the position detection module 2 including a detecting light emitter 21, a reflective mirror 22 and a detecting light receiver 23. The position detection module 2 is mainly used for detecting the initial position of the rotation of the polygonal mirror structure P. Therefore, the position where the position detection module 2 is disposed may be provided with great leeway, as long as the transmitting path of a detecting light emitted by the position detection module 2 does not overlap with the transmitting path of the femtosecond laser light L. The position detection module 2 and the optical correction module 1 of the present embodiment are disposed on two opposite sides of the polygonal mirror structure P, respectively. However, the present disclosure is not limited thereto. The detecting light emitter 21 of the position detection module 2 of the present disclosure provides a detecting light, which may be a laser light on a relatively high frequency level. The detecting light is directed to one of the reflective surfaces P100 of the polygonal mirror structure P, reflected by the reflective surface P100, and then directed to the reflective mirror 22. The detecting light is reflected by the reflective mirror 22 and directed to the detecting light receiver 23. The detecting light receiver 23 receives the aforementioned detecting light to determine the angle of the polygonal mirror structure P at the start of its rotation. Ideally, the incident angle of the detecting light emitted from the detecting light emitter 21 should be the same as the incident angle of the detecting light entering the detecting light receiver 23, and according to such, the angle of the polygonal mirror structure P at the start of its rotation can be determined.

It is worth mentioning that, as shown in FIG. 1, in order to make the laser beam projected from the polygonal mirror structure P more concentrated, a condenser lens module 3 can be disposed between the polygonal mirror structure P and a target object to be cut (such as the semiconductor wafer S). The condenser lens module 3 can include at least one concave mirror or a convex lens, or a combination of both, for the purpose of concentrating the corrected femtosecond laser light L projecting onto the semiconductor wafer S to be cut. The condenser lens module 3 of the present embodiment can be two oppositely disposed concave mirrors. For example, a telecentric F-Theta lens system. However, the present disclosure is not limited thereto.

Figure 2:
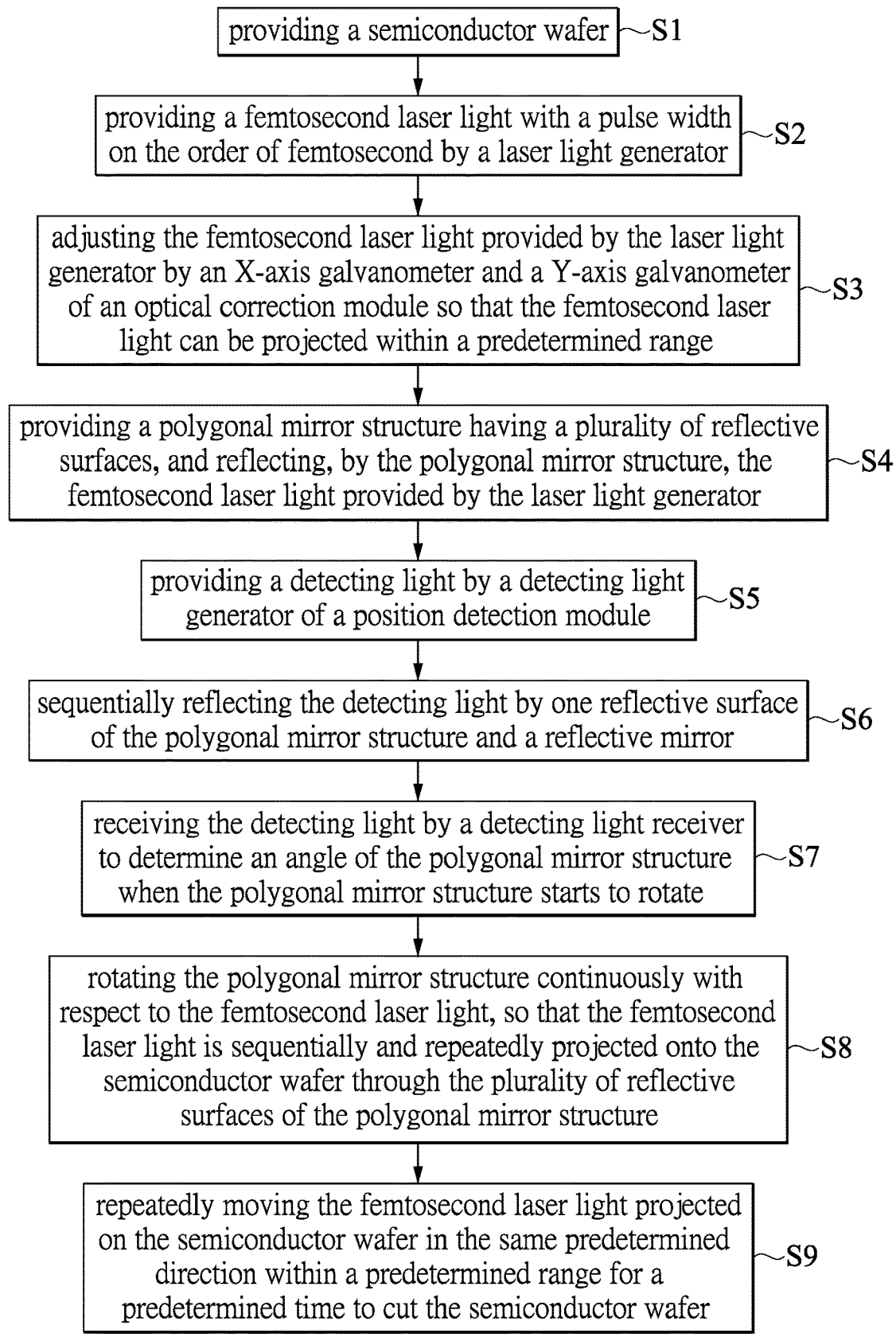
FIG. 2 is a flow chart of a cutting method for a thin semiconductor wafer according to the first embodiment of the present disclosure.

Reference is made to FIG. 2, which is a flow chart of a cutting method of the cutting device D1 for a thin semiconductor wafer according to the present embodiment. The cutting method of this embodiment includes the following steps:

S1: providing the semiconductor wafer S;

S2: providing the femtosecond laser light L with a pulse width on the order of fs by the laser light generator E;

S3: adjusting the femtosecond laser light L provided by the laser light generator E by the X Galvo 11 and the Y Galvo 12 of the optical correction module 1 so that the femtosecond laser light L can be projected within a predetermined range R;

S4: providing the polygonal mirror structure P having a plurality of reflective surfaces P100, and reflecting, by the polygonal mirror structure P, the femtosecond laser light L provided by the laser light generator E;

S5: providing the detecting light by the detecting light generator 21 of the position detection module 2;

S6: sequentially reflecting the detecting light by one reflective surface P100 of the polygonal mirror structure P and the reflective mirror 22;

S7: receiving the detecting light by the detecting light receiver 23 to determine an angle of the polygonal mirror structure P when the polygonal mirror structure P starts to rotate;

S8: rotating the polygonal mirror structure P continuously with respect to the femtosecond laser light L, so that the femtosecond laser light L is sequentially and repeatedly projected onto the semiconductor wafer S through the plurality of reflective surfaces P100 of the polygonal mirror structure P; and S9: repeatedly moving the femtosecond laser light L projected on the semiconductor wafer S in the same predetermined direction within a predetermined range R for a predetermined time to cut the semiconductor wafer S.

It is worth mentioning that the predetermined time may be within 1 second, and the predetermined range R may be a range between any two points on the semiconductor wafer S, or a range between any two straight lines thereon. The predetermined range R on the semiconductor wafer S of the present embodiment may be a straight path between any two points, or an irregular path, or may be a diameter of the semiconductor wafer S. The femtosecond laser light L corrected by the optical correction module 1 can move repeatedly and rapidly in the same direction along a predetermined path within a predetermined range R on the semiconductor wafer S, and the light spot of the femtosecond laser light L formed on the semiconductor wafer S does not deviate from the predetermined path.

Figure 3:
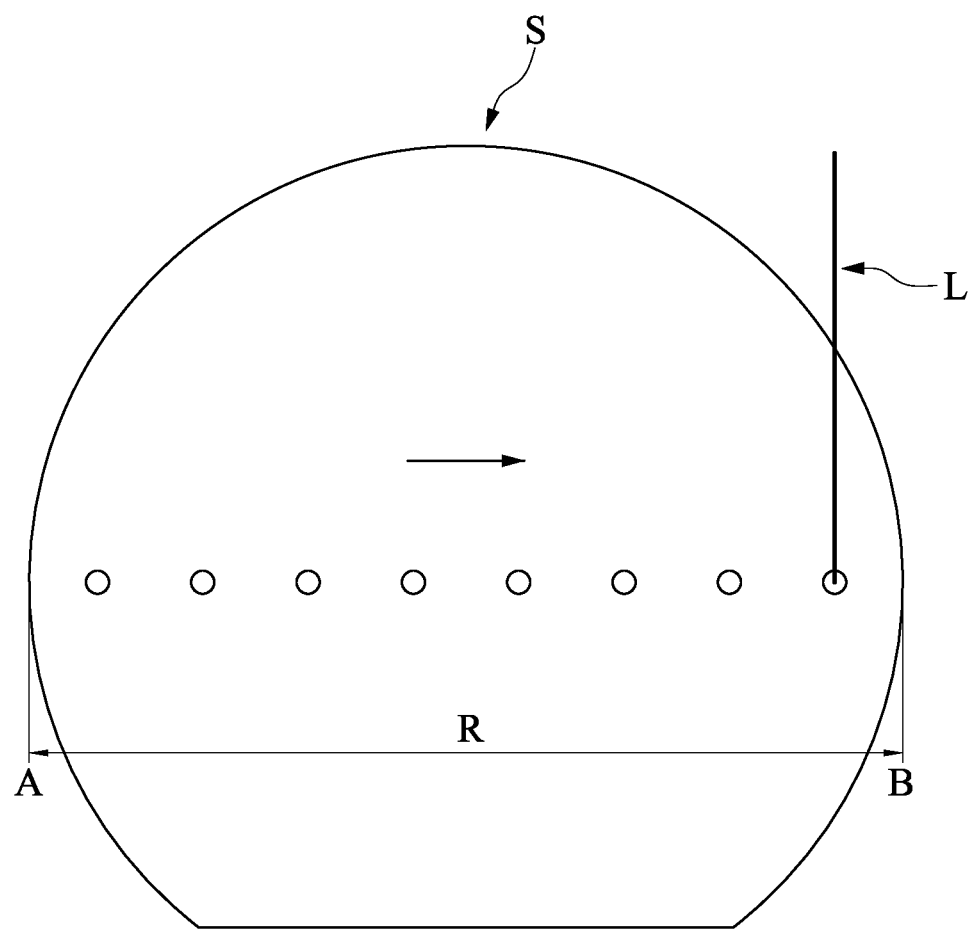
FIGS. 3 to 5 are schematic views of a predetermined range of a femtosecond laser light according to the first embodiment of the present disclosure.
Figure 4:
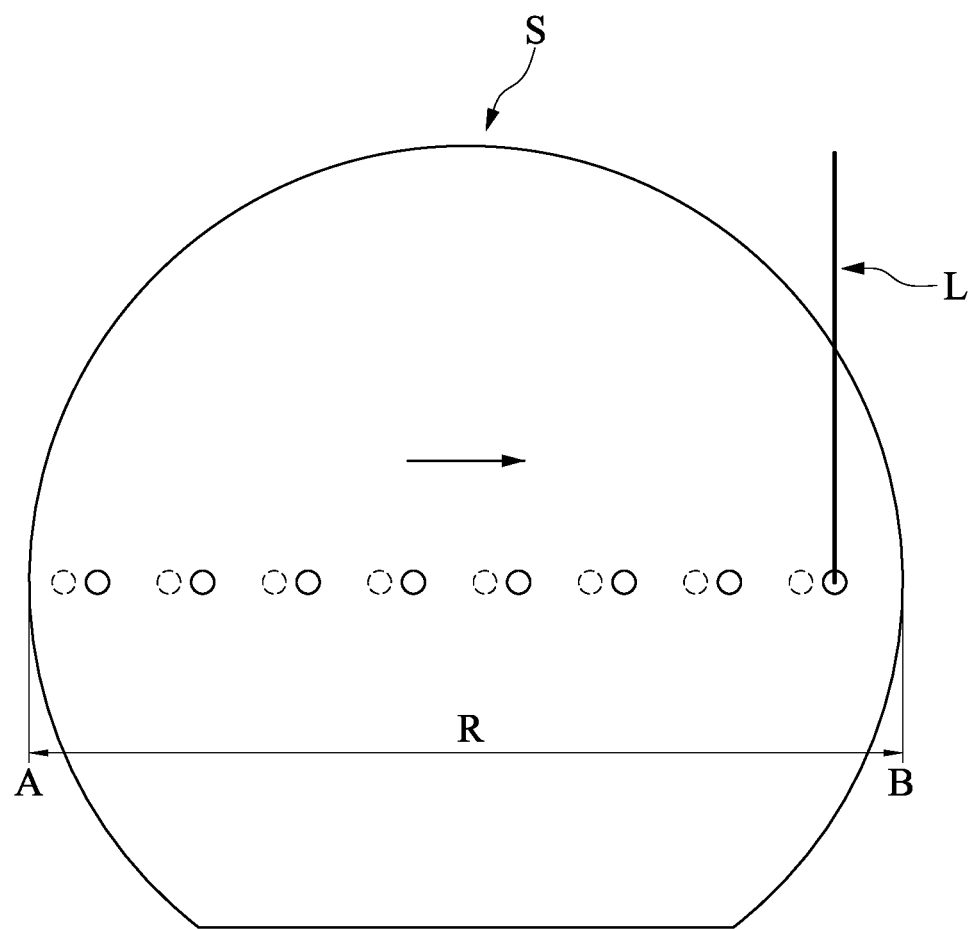
Figure 5:
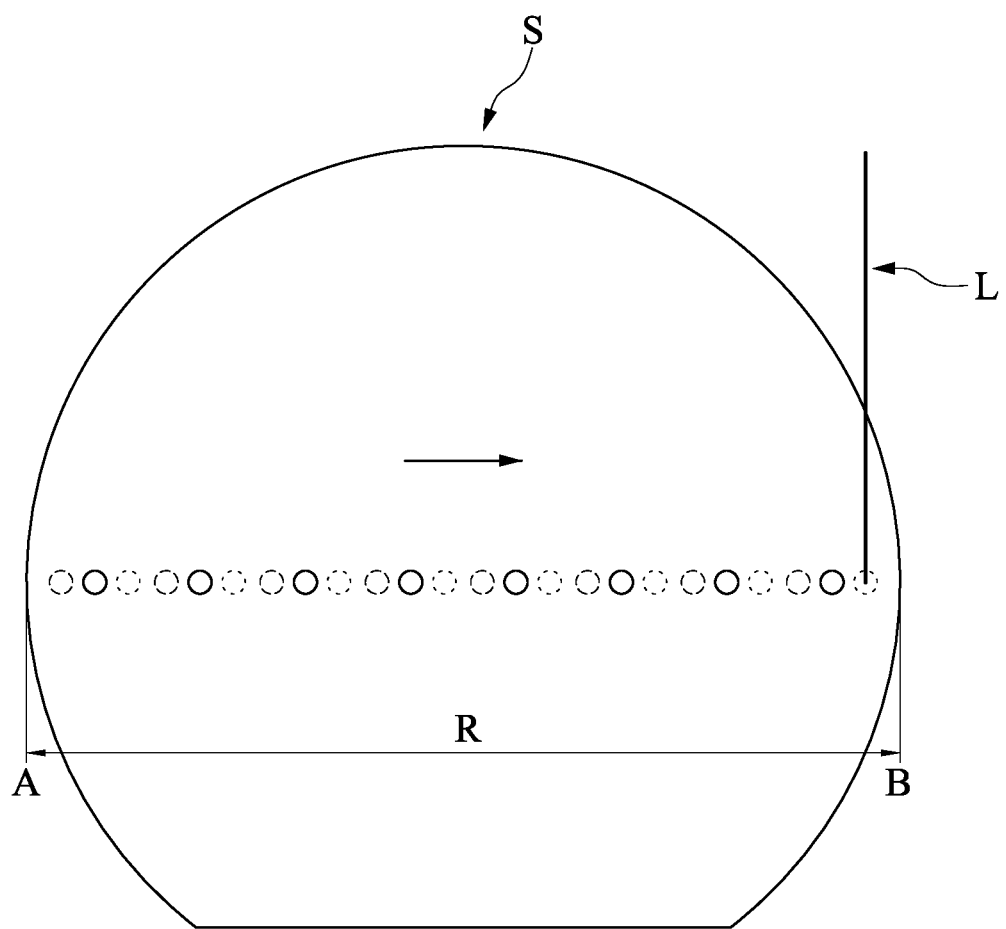
Figure 6:
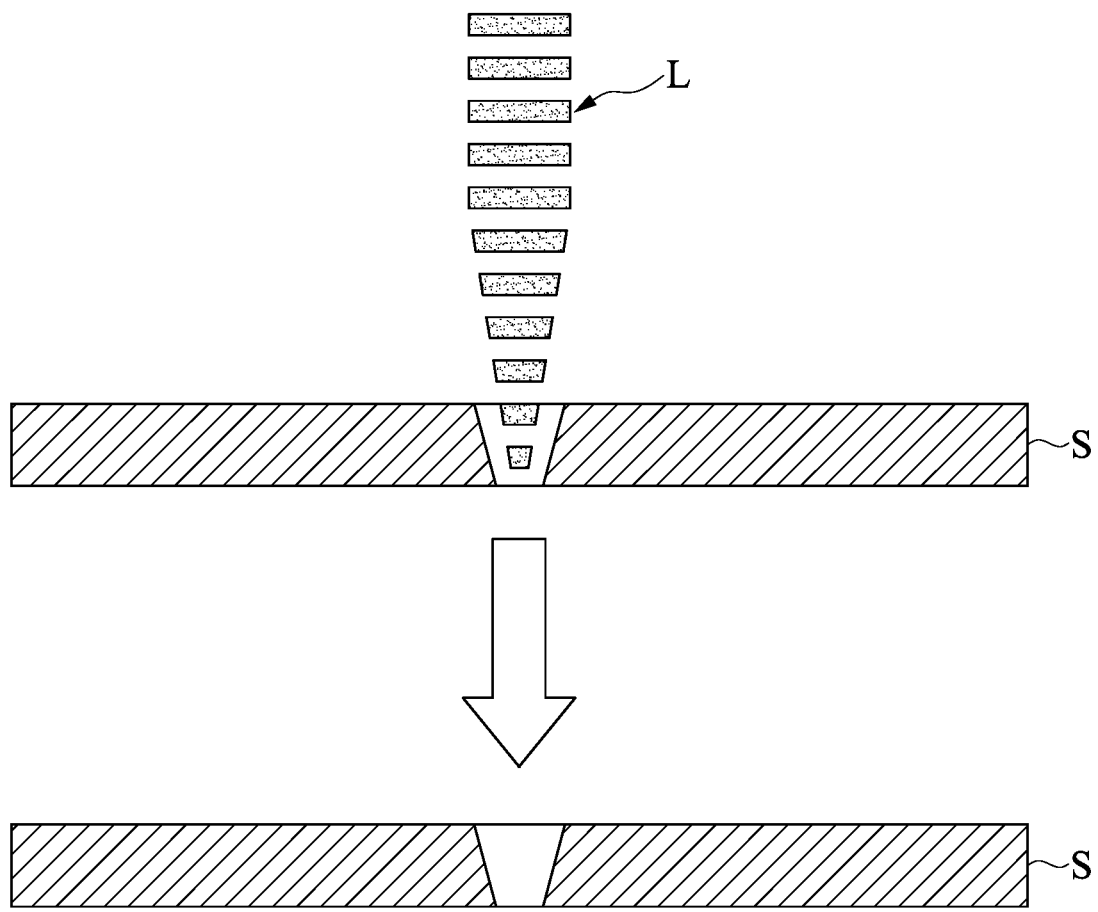
FIGS. 6 to 8 are schematic cross-sectional views of a semiconductor wafer being cut by the femtosecond laser light according to the first embodiment of the present disclosure.
Figure 7:
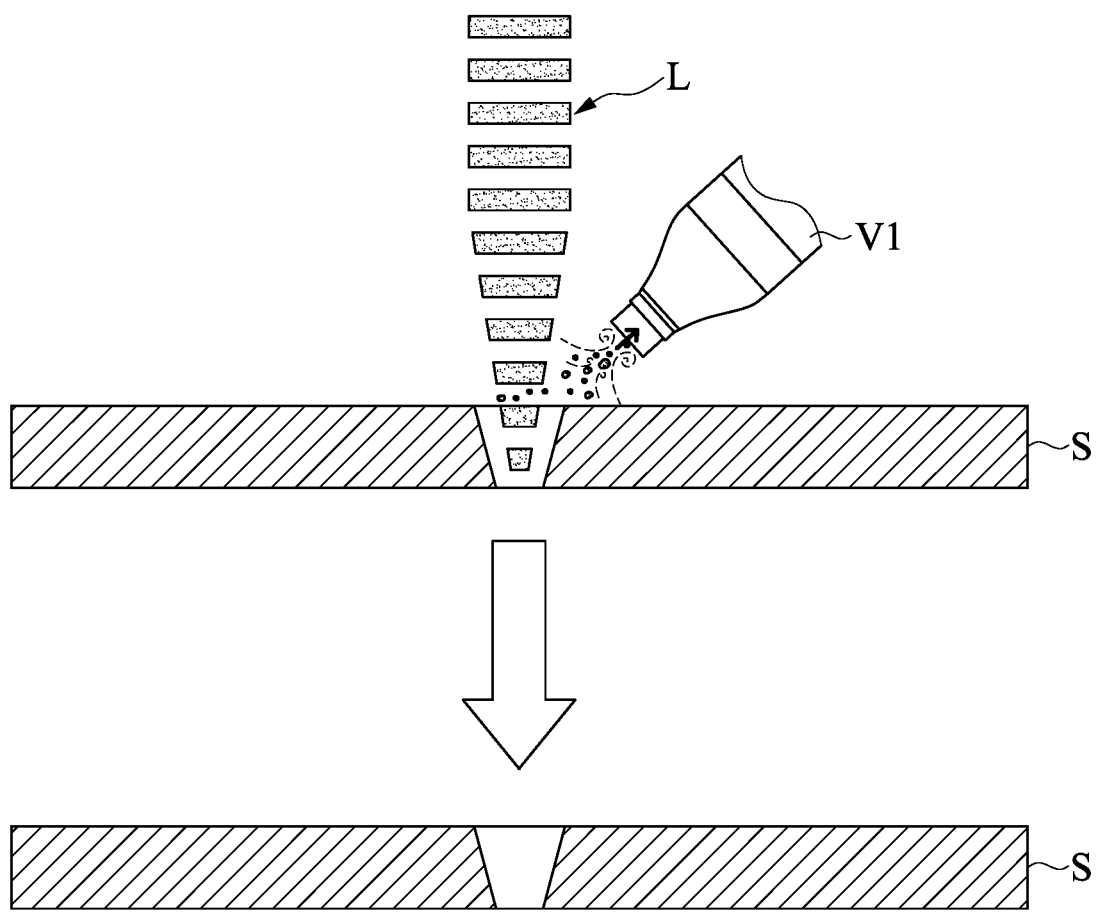
Figure 8:
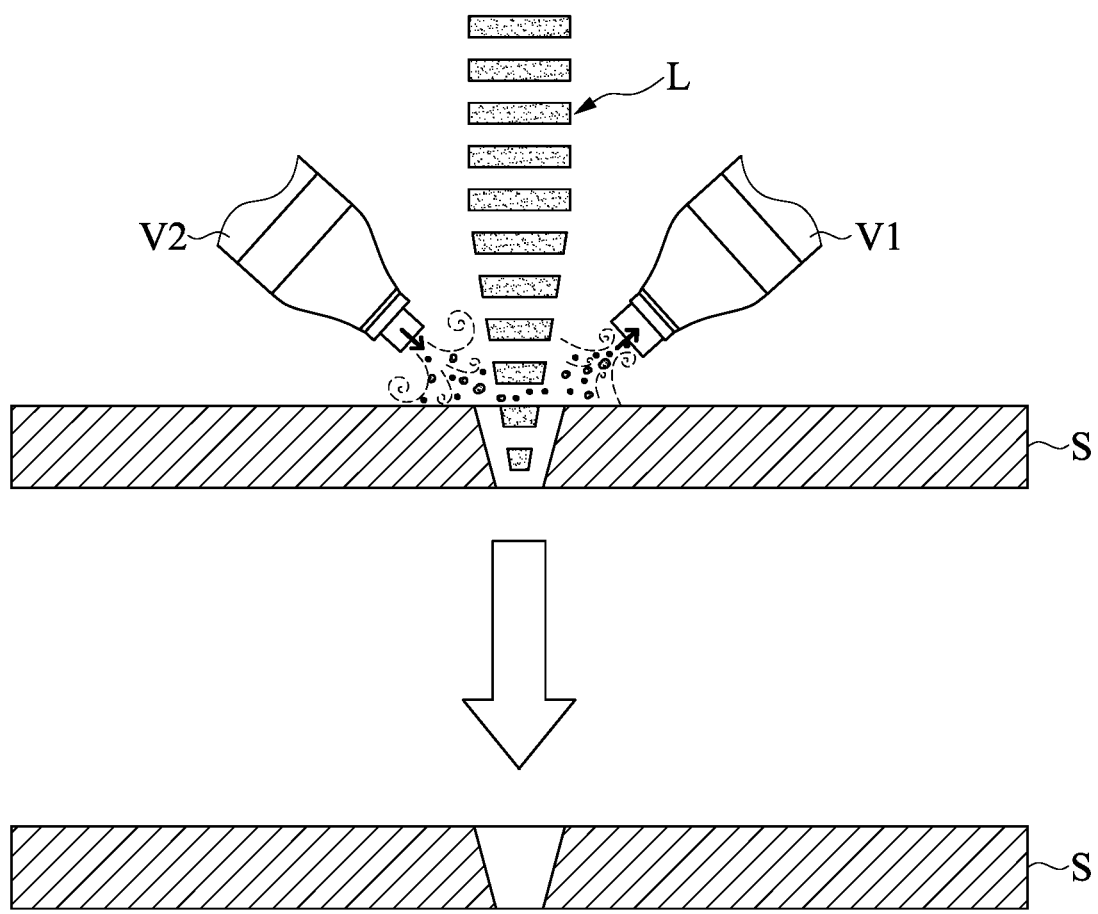

According to the present embodiment, as shown in FIGS. 3 to 6, the predetermined range R can be a straight path. FIGS. 3 to 5 are schematic views of a predetermined range R of a femtosecond laser light according to the present embodiment; and FIGS. 6 to 8 are schematic cross-sectional views of the semiconductor wafer S being cut by the femtosecond laser light L according to the present embodiment. As shown in FIG. 3, after the femtosecond laser light L is emitted by the laser light generator E, the femtosecond laser light L is projected to the predetermined range R on the semiconductor wafer S through the reflection of the optical correction module 1 (see FIG. 1) and the polygonal mirror structure P (see FIG. 1). As shown in FIG. 3, in actual application, the predetermined range R can be defined as a range between any two points A and B on the semiconductor wafer S. The femtosecond laser light L starts from point A, and as the polygonal mirror structure P rotates, the femtosecond laser light L changes its incident angle with respect to the semiconductor wafer, so that the femtosecond laser light L can move along a straight line between point A and point B. Since the pulse width of the femtosecond laser light L of the present disclosure is on the order of fs, the femtosecond laser light L is an ultrashort pulse light and has high energy, so that the semiconductor wafer S can be cut by laser lift-off. Accordingly, the femtosecond laser light L of the present disclosure can form tiny holes penetrating through the semiconductor wafer S along a predetermined path in a predetermined range R on the semiconductor wafer S. Meanwhile, the cutting device D1 of the present disclosure can be set to cut in a predetermined time, and fixed intervals can also be set for interrupting the projection of the femtosecond laser light L on the semiconductor wafer S according to the rotation speed of the polygonal mirror structure P. Accordingly, as shown in FIG. 3, intervals between each two tiny holes can be formed. As shown in FIG. 3, the beam of the femtosecond laser light L moves from point A to point B, forming a plurality of tiny holes having fixed intervals therebetween. Next, referring to FIG. 4, when the beam of the femtosecond laser light L moves to point B, the cutting of the semiconductor wafer S is stopped, and the beam returns to point A, and then moves again from point A to point B along the same path. At this time, with the correction by the position detection module 2, new tiny holes are formed by the femtosecond laser light L on the semiconductor wafer S and are staggered from the previously formed tiny holes, and new fixed intervals are formed. After the femtosecond laser light L completes the movement from point A to point B, a laser lift-off for the plurality of tiny holes would also completed. Next, as shown in FIG. 5, as the polygonal mirror structure P rotates, the femtosecond laser light L stops the laser lift-off for the semiconductor wafer S after reaching the point B, returns to point A, and moves to point B, so as to repeat the laser lift-off procedure in the same direction. At this time, positions of the tiny holes formed on the semiconductor wafer S are shifted from that of the previously formed tiny holes, and after repeatedly performing the afore-referenced practice, the fixed interval between the tiny holes gradually approaches zero. In this way, the femtosecond laser light L of the present embodiment can be repeatedly moved in the same direction between the point A and the point B on the semiconductor wafer S, thereby forming a plurality of densely arranged tiny holes, and eventually causing the semiconductor wafer S to break.

It is worth mentioning that the lateral side of a tiny hole penetrating through the semiconductor wafer S that is formed by the femtosecond laser light L has a slope (FIGS. 6 to 8), and the angle of the slope is maintained at a certain degree. In addition, referring to FIG. 7, the cutting device D1 of the present disclosure further includes an air suction assembly V1 disposed above the semiconductor wafer S along a predetermined range R, preferably equal to or greater than a predetermined range R, for sucking the semiconductor wafer during the laser scanning. Specifically, the air suction assembly V1 sucks in air so that the dust generated by the laser cutting or grooving on the semiconductor wafer S is introduced into the air suction assembly V1 to prevent the dust from remaining on the surface of the semiconductor wafer S or inside the cutting device D1, so as to increase cutting efficiency. Referring to FIG. 8, the cutting device D1 of the present disclosure further includes a blowing assembly V2 disposed above the semiconductor wafer S relative to the air suction assembly V1 along the predetermined range R, preferably equal to or greater than the predetermined range R, and used to blow air toward the dust generated by the laser cutting or grooving, so that the dust is blown in the direction of the air suction assembly V1, to facilitate the dust suction of the air suction assembly V1, improve cutting efficiency, and reduce pollution in the work environment.

Figure 10:
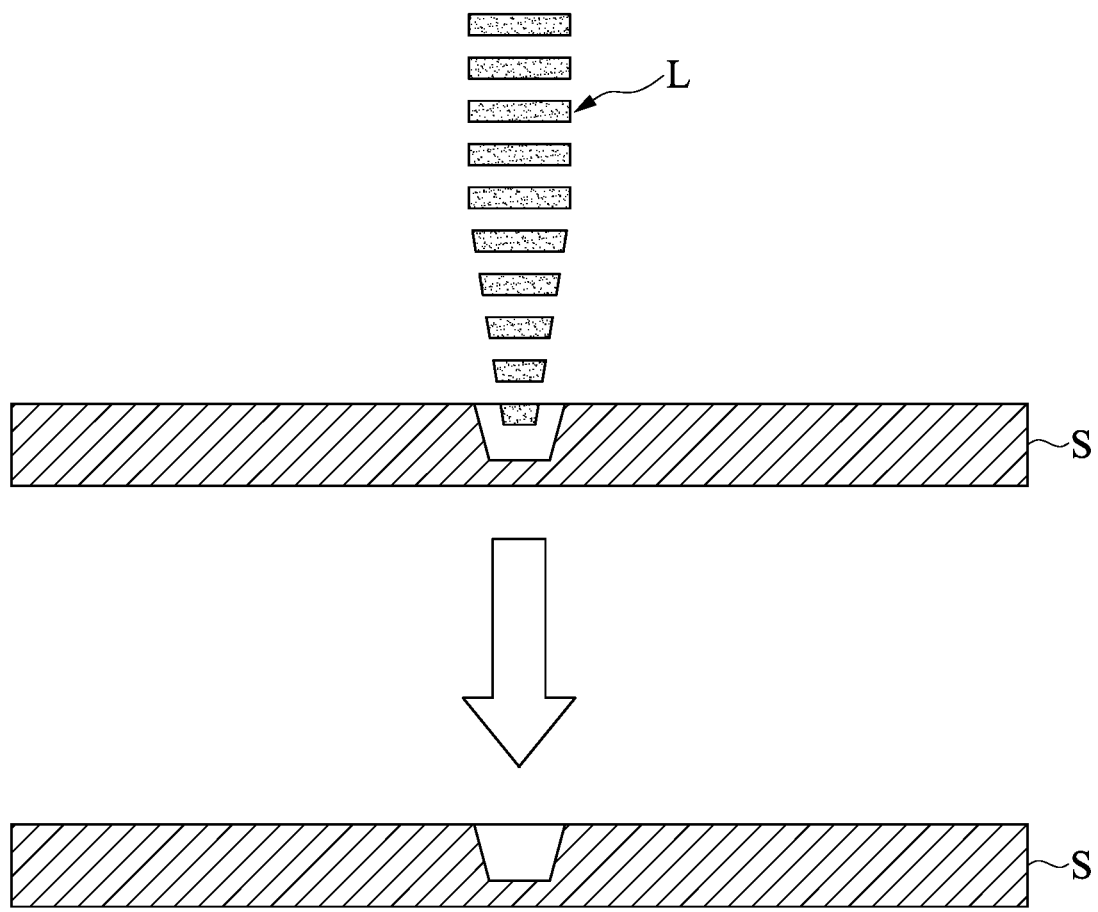
FIGS. 10 to 12 are schematic cross-sectional views of a semiconductor wafer being cut by a femtosecond laser light according to the second embodiment of the present disclosure.
Figure 11:
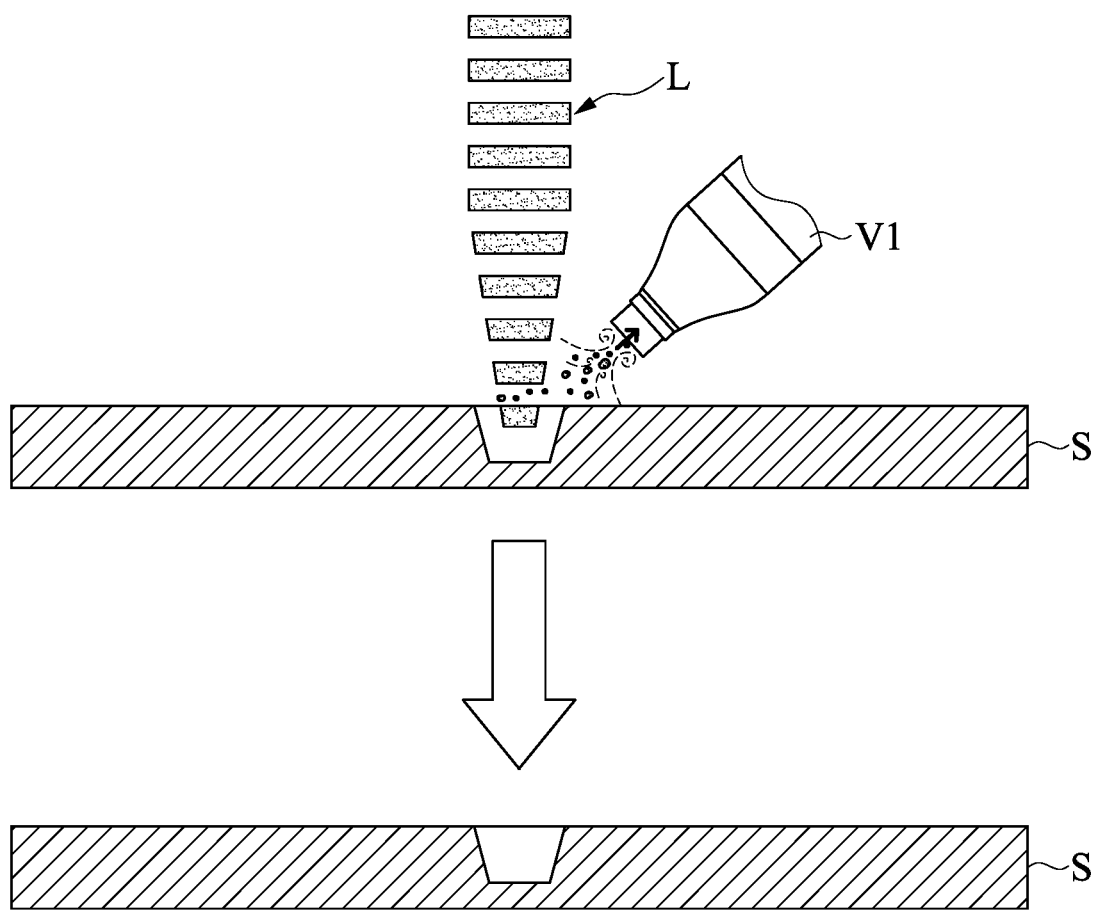
Figure 12:
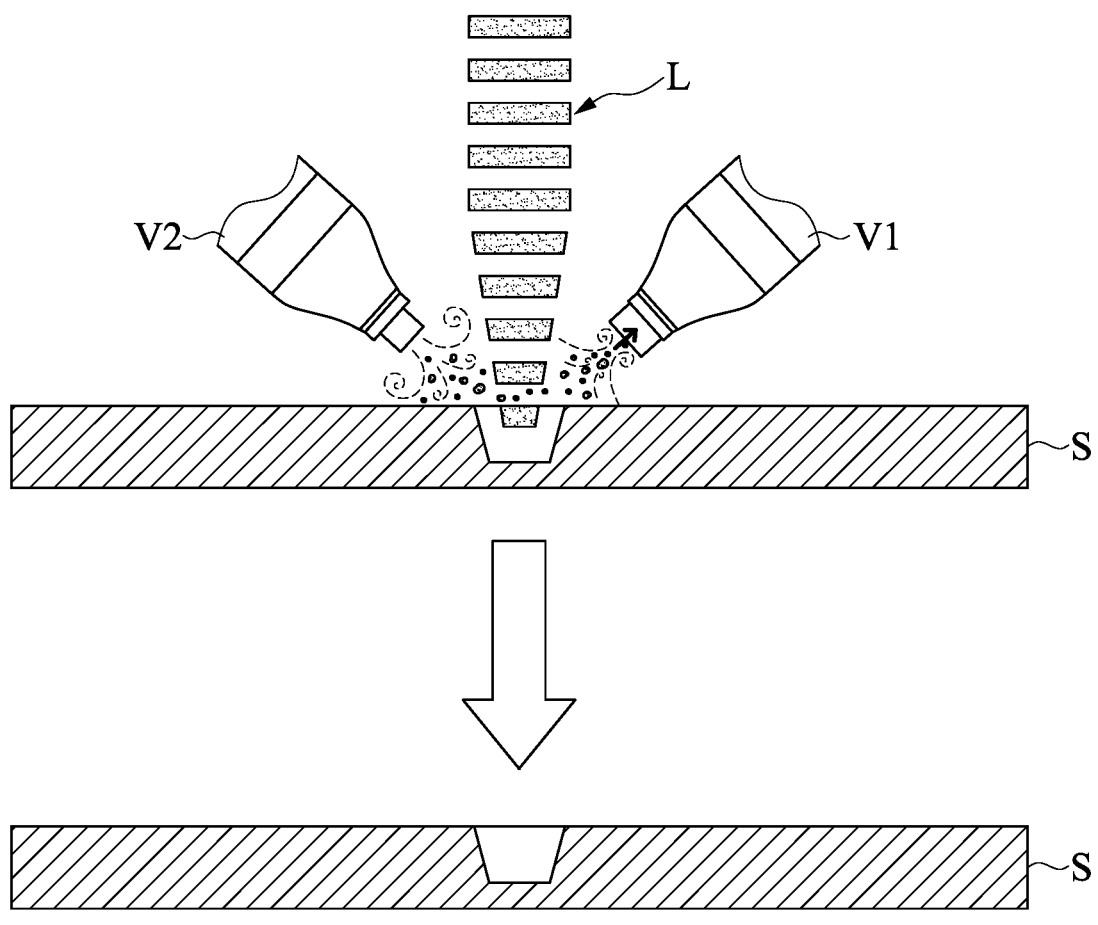

In addition, the present disclosure can also form a trench by grooving the semiconductor wafer S by the femtosecond laser light L of the cutting device D1 (see FIGS. 10 to 12). In addition, referring to FIG. 11, the cutting device D1 of the present disclosure further includes the air suction assembly V1 disposed above the semiconductor wafer S along a predetermined range R, preferably equal to or greater than a predetermined range R, for sucking the semiconductor wafer during the laser scanning. Specifically, the air suction assembly V1 sucks in air so that the dust generated by the laser cutting or grooving on the semiconductor wafer S is introduced into the pumping component V1 to prevent the dust from remaining on the surface of the semiconductor wafer S or inside the cutting device D1 to increase cutting efficiency.

Referring to FIG. 12, the cutting device D1 of the present disclosure further includes a blowing assembly V2 disposed above the semiconductor wafer S relative to the pumping component V1 along the predetermined range R, preferably equal to or greater than the predetermined range R, and used to blow air toward the dust generated by the laser cutting or grooving, so that the dust is blown in the direction toward the air suction assembly V1, to facilitate the dust suction of the air suction assembly V1, improve cutting efficiency, and reduce pollution in working environment.

In this way, through the ultra-short pulse light with higher energy, and the rotation speed of the polygonal mirror structure P, the femtosecond laser light L repeatedly moves in the same predetermined direction to instantaneously cut the semiconductor wafer S. At the same time, since the cutting rate can be controlled to be within a predetermined time, it is possible to perform cutting on a thin semiconductor wafer, such as a semiconductor wafer having a thickness less than 100 μm, and more particularly for a semiconductor wafer having a thickness less than 50 μm. Furthermore, due to the ultrashort pulse characteristics of the femtosecond laser light L, the laser lift-off range can be controlled to a minimum, so that the lateral sides of the cut-off semiconductor dies can be relatively even.

Second Embodiment

Figure 9:
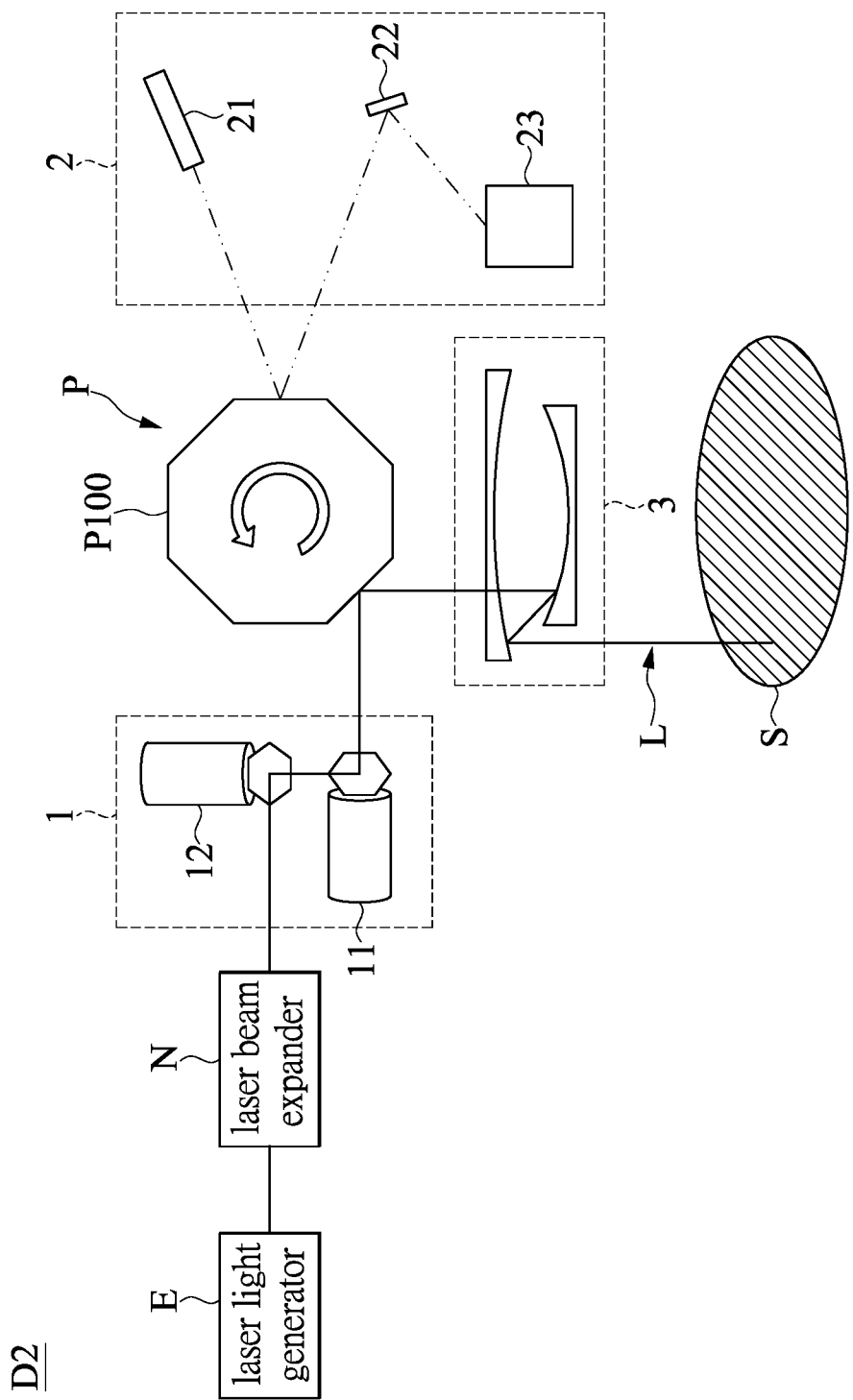
FIG. 9 is a schematic diagram of a cutting device for a thin semiconductor wafer according to a second embodiment of the present disclosure.

The present disclosure further provides another embodiment. Reference is made to FIG. 9, which illustrates another cutting device D2 for a thin semiconductor wafer according to the second embodiment of the present disclosure. Similar to the first embodiment of the present disclosure, the cutting device D2 includes a laser light generator E, a polygonal mirror structure P, an optical correction module 1 and a position detection module 2. The cutting device D2 further includes a laser beam expander N disposed between the laser light generator E and the optical correction module 1 for adjusting the diameter of the light beam.

Therefore, through the technical features including "a laser light generator E for providing femtosecond laser light L having a pulse width on the order of fs," "a polygonal mirror structure P having a plurality of reflective surfaces P100 for reflecting the femtosecond laser light L provided by the generator E" and "the polygonal mirror structure P rotating continuously with respect to the femtosecond laser light L, so that the femtosecond laser light L is sequentially and repeatedly reflected by the plurality of reflective surfaces P100 of the polygonal mirror structure P and projected on the semiconductor wafer S," the cutting device for a thin semiconductor wafer and the cutting method thereof according to the present disclosure can expand the application range of a high-speed laser (femtosecond laser), with a scanning speed reaching more than 100 m/s, a femtosecond laser repetition frequency reaching the order of MHz, and an average power reaching more than 100 W, which allows the femtosecond laser light L projected on the semiconductor wafer S to repeatedly move in the same predetermined direction within a predetermined range R for a predetermined time to cut the semiconductor wafer S.

Further, the ultra-short pulse light with higher energy, in cooperation with the rotation speed of the polygonal mirror structure P, can instantaneously repeatedly move back and forth to cut the semiconductor wafer S. At the same time, since the cutting rate can be controlled to be within a predetermined time, it is possible to perform cutting on a thin semiconductor wafer, such as a semiconductor wafer having a thickness less than 100 μm, and more particularly for a semiconductor wafer having a thickness less than 50 µm. Furthermore, due to the ultrashort pulse characteristics of the femtosecond laser light L, the laser lift-off range can be controlled to a minimum, so that the lateral sides of the cut-off semiconductor dies can be relatively even.

Further, through the ultra-short pulse light provided by a laser generator that is with high energy and a pulse repetition frequency greater than 1 MHz, the cutting device for a thin semiconductor wafer and the cutting method thereof according to the present disclosure can maintain a small HAZ, so that the lateral sides of the cut-off semiconductor dies can be relatively even, and the precision of laser processing can be effectively improved. In addition, with the aid of the rotation speed of the polygonal mirror structure P, the cutting rate can be controlled to be within a predetermined time, so it is possible to perform cutting on a thin semiconductor wafer, such as a semiconductor wafer having a thickness less than 100 µm, and more particularly for a semiconductor wafer having a thickness less than 50 µm.

The foregoing description of the exemplary embodiments of the present disclosure has been presented only for the purposes of illustration and description and is not intended to be exhaustive or to limit the present disclosure to the precise forms disclosed. Many modifications and variations are possible in light of the above teaching.

Certain embodiments were chosen and described in order to explain the principles of the present disclosure and their practical application so as to enable others skilled in the art to utilize the present disclosure and various embodiments and with various modifications as are suited to the particular use contemplated. Alternative embodiments will become apparent to those skilled in the art to which the present disclosure pertains without departing from its spirit and scope.

What is claimed is:

1. A cutting device for a thin semiconductor wafer, comprising:
    a laser light generator configured to provide a femtosecond laser light with a pulse width on a femtosecond order;
    a polygonal mirror structure having a plurality of reflective surfaces and configured to
        reflect the femtosecond laser light; and
        rotate continuously with respect to the femtosecond laser light, such that the femtosecond laser light is sequentially and repeatedly reflected by the plurality of reflective surfaces and projected on a semiconductor wafer, and moves repeatedly along a same predetermined direction in a predetermined range during a predetermined time to cut the semiconductor wafer; and
    a position detection module including a detecting light emitter, a reflective mirror and a detecting light receiver;
    wherein, after a detecting light provided by the detecting light emitter is sequentially reflected by one of the reflective surfaces of the polygonal mirror structure and the reflective mirror, the detecting light receiver is configured to receive the detection light and detect an initial position of a rotation of the polygonal mirror structure according to the detecting light;
    wherein, when the femtosecond laser light is provided by the laser light generator and the detecting light is provided by the detecting light emitter, a transmitting path of the detecting light transmitted from the position detection module to the detecting light receiver does not overlap with a transmitting path of the femtosecond laser light transmitted from the laser light generator to the semiconductor wafer.

2. The cutting device according to claim 1, further comprising an optical correction module including an X-axis galvanometer and a Y-axis galvanometer, wherein the femtosecond laser light is adjusted by the X-axis galvanometer and the Y-axis galvanometer so as to be projected within the predetermined range.

3. The cutting device according to claim 1, further comprising a laser beam expander configured to adjust a diameter of the femtosecond laser light provided by the laser light generator.

4. The cutting device according to claim 1, wherein a thickness of the semiconductor wafer is less than 100 µm.

5. The cutting device according to claim 1, further comprising: an air suction assembly disposed above the semiconductor wafer and a blowing assembly disposed above the semiconductor wafer, wherein the air suction assembly sucks in air so that dust generated by the laser cutting on the semiconductor wafer is introduced into the air suction assembly, and the blowing assembly blows air toward the dust generated by the laser cutting, so that the dust is blown in the direction toward the air suction assembly.

6. A cutting method for a thin semiconductor wafer, comprising:
    providing a semiconductor wafer;
    providing, by a laser light generator, a femtosecond laser light with a pulse width on a femtosecond order; and
    providing a polygonal mirror structure having a plurality of reflective surfaces, wherein the femtosecond laser light is reflected by the polygonal mirror structure,
    wherein the polygonal mirror structure rotates continuously with respect to the femtosecond laser light, such that the femtosecond laser light is sequentially and repeatedly reflected by the plurality of reflective surfaces and projected on the semiconductor wafer, and moves repeatedly along a same predetermined direction within a predetermined range and within a predetermined time to cut the semiconductor wafer;
    wherein the cutting method further comprises:
        providing, by a detecting light emitter, a detecting light;
        reflecting, sequentially by one of the reflective surfaces of the polygonal mirror structure and a reflective mirror, the detecting light; and
        receiving, by a detecting light receiver, the detecting light to detect an initial position of a rotation of the polygonal mirror structure according to the detecting light;
    wherein a transmitting path of the detecting light transmitted from the position detection module to the detecting light receiver does not overlap with a transmitting path of the femtosecond laser light transmitted from the laser light generator to the semiconductor wafer.

7. The cutting method according to claim 6, further comprising:
    adjusting, by an X-axis galvanometer and a Y-axis galvanometer of an optical correction module, the femtosecond laser light so that the femtosecond laser light is projected within the predetermined range.

8. The cutting method according to claim 6, further comprising:
    adjusting, by a laser beam expander, a diameter of the femtosecond laser light provided by the laser light generator.

9. The cutting method according to claim 6, wherein a thickness of the semiconductor wafer is less than 100 μm.

* * * * *